US010790635B2

(12) United States Patent
Tankhilevich

(10) Patent No.: US 10,790,635 B2
(45) Date of Patent: *Sep. 29, 2020

(54) TECHNIQUE OF HIGH-SPEED MAGNETIC RECORDING BASED ON MANIPULATING PINNING LAYER IN MAGNETIC TUNNEL JUNCTION-BASED MEMORY BY USING TERAHERTZ MAGNON LASER

(71) Applicant: Magtera, Inc., Walnut Creek, CA (US)

(72) Inventor: Boris G. Tankhilevich, Walnut Creek, CA (US)

(73) Assignee: Magtera, Inc., Walnut Creek, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/704,090

(22) Filed: Dec. 5, 2019

(65) Prior Publication Data

US 2020/0265884 A1    Aug. 20, 2020

Related U.S. Application Data

(63) Continuation-in-part of application No. 16/245,224, filed on Jan. 10, 2019, and a continuation-in-part of application No. 16/245,247, filed on Jan. 10, 2019.

(51) Int. Cl.
*H01S 4/00* (2006.01)
*H01S 5/02* (2006.01)
(Continued)

(52) U.S. Cl.
CPC .............. *H01S 4/00* (2013.01); *H04B 11/00* (2013.01); *B06B 1/00* (2013.01)

(58) Field of Classification Search
CPC .. H01S 5/04252; H01S 5/0208; H01S 5/0213; H01S 5/3402; H01S 5/0218; H01S 5/0622; H01F 41/32; H03K 19/0944
(Continued)

(56) References Cited

U.S. PATENT DOCUMENTS 7,430,074 B2    9/2008    Korenblit et al.
7,508,578 B2    3/2009    Korenblit et al.
(Continued)

OTHER PUBLICATIONS

Notice of Allowance received for U.S. Appl. No. 16/245,224 dated Apr. 14, 2020, 27 pages.
(Continued)

*Primary Examiner* — Tuan N Nguyen
(74) *Attorney, Agent, or Firm* — Amin, Turocy & Watson, LLP

(57) ABSTRACT

An apparatus for novel technique of high-speed magnetic recording based on manipulating pinning layer in magnetic tunnel junction-based memory by using terahertz magnon laser is provided. The apparatus comprises a terahertz writing head configured to generate a tunable terahertz writing signal and a memory cell including a spacer that comprises a thickness configured based on Ruderman-Kittel-Kasuya-Yosida (RKKY) interaction. The memory cell comprises two separate memory states: a first binary state and a second binary state; wherein the first binary memory state corresponds to a ferromagnetic sign of the Ruderman-Kittel-Kasuya-Yosida (RKKY) interaction corresponding to a first thickness value of the spacer; and wherein the second binary memory state corresponds to an antiferromagnetic sign of the Ruderman-Kittel-Kasuya-Yosida (RKKY) interaction corresponding to a second thickness value of the spacer. The thickness of the spacer is manipulated by the tunable terahertz writing signal.

17 Claims, 9 Drawing Sheets

(51) Int. Cl.
*H04B 11/00* (2006.01)
*B06B 1/00* (2006.01)

(58) Field of Classification Search
USPC .............................. 372/4; 359/342; 326/49
See application file for complete search history.

(56) References Cited

U.S. PATENT DOCUMENTS

| | | |
|---|---|---|
| 7,982,946 B1 | 7/2011 | Korenblit et al. |
| 8,031,397 B1 | 10/2011 | Korenblit et al. |
| 9,132,451 B1 | 9/2015 | Tankhilevich |
| 9,136,665 B1 | 9/2015 | Tankhilevich et al. |
| 9,418,648 B1 * | 8/2016 | Tankhilevich ......... G10K 11/18 |
| 2006/0118839 A1 | 6/2006 | Sugahara et al. |
| 2012/0091548 A1 * | 4/2012 | Sukegawa .............. B82Y 40/00 |
| | | 257/421 |
| 2012/0112299 A1 * | 5/2012 | Inomata ............... G01R 33/098 |
| | | 257/421 |

OTHER PUBLICATIONS

Notice of Allowance received for U.S. Appl. No. 16/245,247 dated May 27, 2020, 29 pages.

International Preliminary Report on Patentability received for PCT Application Serial No. PCT/US2020/012985 dated Apr. 2, 2020, 18 pages.

Vilkov et al., "Generation of Terahertz Radiation Spectra by Radiation Sources Based on Solid-State Micro- and Nanostructures and Detection of Terahertz Spectra", DOI: 10.1134/S106422691809022X, Sep. 28, 2018, pp. 1015-1026.

Sulymenko et al., "Terahertz-Frequency Signal Source Based on an Antiferromagnetic Tunnel Junction ", DOI: 10.1109/LMAG.2018. 2852291, Jul. 2, 2018, 5 pages.

Sulyaev et al., "Generation of Terahertz Radiation in Magnetic Junctions based on Nanowires." DOI: 10.1134/S1063785019030271, May 6, 2019, pp. 271-273.

International Preliminary Report on Patentability received for PCT Application Serial No. PCT/US2020/012229 dated Apr. 7, 2020, 19 pages.

International Preliminary Report on Patentability received for PCT Application Serial No. PCT/US2020/012982 dated Apr. 20, 2020, 17 pages.

* cited by examiner

Variation of the indirect exchange coupling constant, J of a free electron gas in the neighborhood of a point magnetic moment at the origin r=0

TECHNIQUE OF HIGH-SPEED MAGNETIC RECORDING BASED ON MANIPULATING PINNING LAYER IN MAGNETIC TUNNEL JUNCTION-BASED MEMORY BY USING TERAHERTZ MAGNON LASER

CROSS REFERENCE TO RELATED APPLICATIONS

This application is also a continuation-in-part of, and claims priority to, U.S. patent application Ser. No. 16/245,224 titled "TUNABLE MULTILAYER TERAHERTZ MAGNON GENERATOR" and filed on Jan. 10, 2019. This application is also a continuation-in-part of, and claims priority to, U.S. patent application Ser. No. 16/245,247 titled "TERAHERTZ MAGNON GENERATOR COMPRISING PLURALITY OF SINGLE TERAHERTZ MAGNON LASERS" and filed on Jan. 10, 2019. The entireties of the foregoing applications listed herein are hereby incorporated by reference.

TECHNICAL FIELD

The current invention relates to the field of magnon lasers employed to generate terahertz radiation.

BACKGROUND ART

Terahertz (THz) radiation, an electromagnetic radiation in a frequency interval from 0.1 THz to 30 THz, occupies the portion of the electromagnetic spectrum between the microwave band and the infrared band.

A THz photon has an energy that is less than the energy of an optical photon. That is why THz-waves can penetrate deep into substances where optical waves cannot penetrate. At THz frequencies, molecules vibrate. That is why THz waves are useful in the study of molecules.

Indeed, the unique rotational and vibrational responses of molecules within the THz range provide information that is generally absent in optical, X-ray and NMR images. A THz wave can easily penetrate and inspect the insides of most dielectric materials, which are opaque to visible light and low contrast to X-rays, making THz waves a useful complementary imaging source.

For example, THz waves maintain reasonable penetration depth in certain common materials, such as clothes, plastic, wood, sand and soil. Therefore, THz technology has the potential to detect explosives packaged or buried within these materials because the explosives have unique THz spectral properties when compared to the surrounding materials. The spectral fingerprints of explosive materials can be expected in the THz band, and THz imaging can be applied for landmine detection. However, at present, efficient, compact, solid-state sources for the spectral range 0.1-30 THz are still lacking.

Indeed, broadband pulsed THz sources are usually based on the excitation of different materials with ultra-short laser pulses. Several different mechanisms have been exploited to generate THz radiation, including photo carrier acceleration in photo conducting antennas, second-order non-linear effects in electro-optic crystals etc.

For narrowband THz sources, solid-state lasers are often considered. They are based on inter-band transitions in narrow gap semiconductors or on inter sub band transitions, i.e. transitions in quantum confined structures, e.g. nano-structures, between confined conduction or valence states. To get THz radiation from direct inter band transitions, near zero gap semiconductors are required. For inter sub band transitions conventional wide gap materials can be used but require precise complicated structures. At present the construction of multiple quantum-well semiconductor structures for laser emission is feasible.

The quantum cascade consists of a repeating structure, in which each repeating unit is made up of an injector and an active region. In the active region, a population inversion exists and electron transition to a lower energy level occurs, emitting photons at a specific wavelength. Kohler et al. (R. Kohler et al., Nature 417, 156 (2002)) designed a THz quantum cascade laser operating at 4.4 THz. The laser consisted of a total over 700 quantum wells, and demonstrated pulse operation at temperature of 10 K. For a review, please see, e.g., B Ferguson and X.-C. Zhang, Nat. Matter, 26 (2002).

The latest progress in QCL generators was reported by Manijeh Razeghi, et al. in Photonics Spectra, December, 48-51 (2016). The authors used nonlinear mixing of two QCL. However, the usage of nonlinear mixers invites the inherent limitations. Indeed, the nonlinear QCL mixers are very complicated devices (each such QCL comprising multiple barrier layers and multiple well layers that should be fabricated with the accuracy up to 0.1 nm), have low output power in continuous regime (these devices reach the power output up to 0.5 milliwatt only in pulsed regime); and have very limited tunability in the region of between (2-4.45) THz.

AdTech Optics located in the City of Industry, Calif., has been developing and producing innovative QC lasers since 2005. AdTech's QCLs are designed to cover most of the mid-infrared spectral range, from $\lambda=3.8$ μm (78 THz) to $\lambda=12.5$ μm (23.9 THz). Almost all of AdTech's QCLs operate continuously at room temperature and can be designed to work at a single frequency by use of distributed-feedback waveguide fabrication. However, AdTech's QCLs are only mechanically tunable which makes those QCL unpractical for the majority of applications including the spectrometric, communication, etc., to name just a few applications.

SUMMARY

An apparatus comprising a terahertz writing head for a memory cell is provided. In one example, the apparatus includes a terahertz writing head configured to generate a tunable terahertz writing signal; and a memory cell including a spacer that comprises a thickness configured based on Ruderman-Kittel-Kasuya-Yosida (RKKY) interaction. The memory cell includes two separate memory states: a first binary state and a second binary state; wherein the first binary memory state corresponds to a ferromagnetic sign of the Ruderman-Kittel-Kasuya-Yosida (RKKY) interaction corresponding to a first thickness value of the spacer; and wherein the second binary memory state corresponds to an antiferromagnetic sign of the Ruderman-Kittel-Kasuya-Yosida (RKKY) interaction corresponding to a second thickness value of the spacer. The thickness of the spacer is manipulated by the tunable terahertz writing signal generated by the terahertz writing head. The first thickness value of the spacer corresponds to a first terahertz signal generated by the terahertz writing head, and wherein the second thickness value of the spacer corresponds to a second terahertz signal generated by the terahertz writing head. This Summary is provided to introduce a selection of concepts that are further described below in the Detailed Description. This Summary is not intended to identify key or essential features of the claimed subject matter, nor is it intended to be used as an aid in determining the scope of the claimed subject matter.

DESCRIPTION OF THE DRAWINGS

The accompanying drawings, which are incorporated in and form a part of this specification, illustrate embodiments of the technology and, together with the description, explain the principles below.

DETAILED DESCRIPTION

Reference now be made in detail to the embodiments of the technology, examples of which are illustrated in the accompanying drawings. While the present technology will be described in conjunction with the various embodiments, it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following detailed description, numerous specific details are set forth in order to provide a thorough understanding of the presented embodiments. However, it will be obvious to one of ordinary skill in the art that the presented embodiments may be practiced without these specific details. In other instances, well known methods, procedures, components, and circuits have not been described in detail as not to unnecessarily obscure aspects of the presented embodiments.

Figure 1:
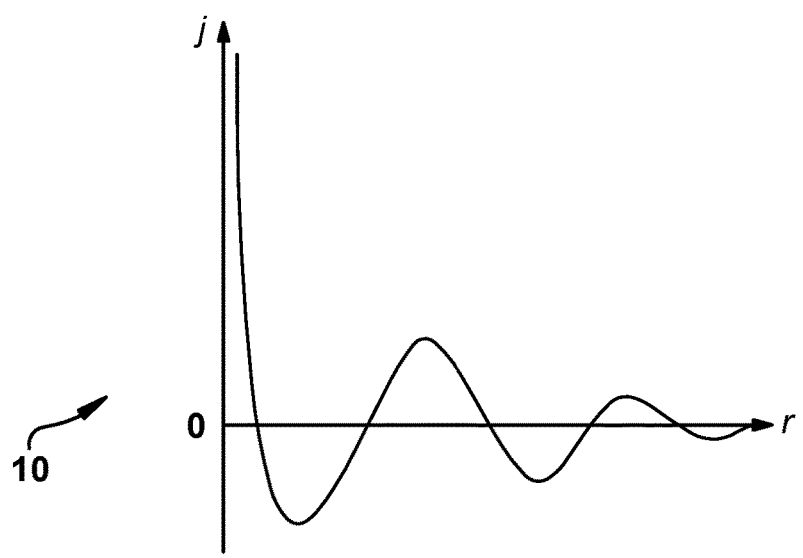
FIG. 1 depicts a variation of the indirect exchange coupling constant, J of a free electron gas in the neighborhood of a point magnetic moment at the origin r=0 for the purposes of the present technology.

In an embodiment of the present technology, FIG. 1 depicts a variation 10 of the indirect exchange coupling constant J of the Ruderman-Kittel-Kasuya-Yosida (RKKY) interaction, of a free electron gas in the neighborhood of a point magnetic moment at the origin r=0. The RKKY exchange coefficient, J oscillates from positive to negative as the separation of the ions changes and has the damped oscillatory nature. Therefore, depending upon the separation between a pair of ions their magnetic coupling can be ferromagnetic or antiferromagnetic. A magnetic ion induces a spin polarization in the conduction electrons in its neighborhood. This spin polarization in the itinerant electrons is felt by the moments of other magnetic ions within range, leading to an indirect coupling.

In rare-earth metals, whose magnetic electrons in the 4f shell are shielded by the 5a and 5p electrons, direct exchange is rather weak and insignificant and indirect exchange via the conduction electrons gives rise to magnetic order in these materials. The RKKY interaction comprises a double exchange interaction in the limit of $J/t \gg 1$, where t is the transfer matrix element of the corresponding Hamiltonian. The double-exchange mechanism is a type of a magnetic exchange that may arise between ions in different oxidation states. First proposed by Clarence Zener, this theory predicts the relative ease with which an electron may be exchanged between two species and has important implications for whether materials are ferromagnetic, antiferromagnetic, or exhibit spiral magnetism.

Figure 2:
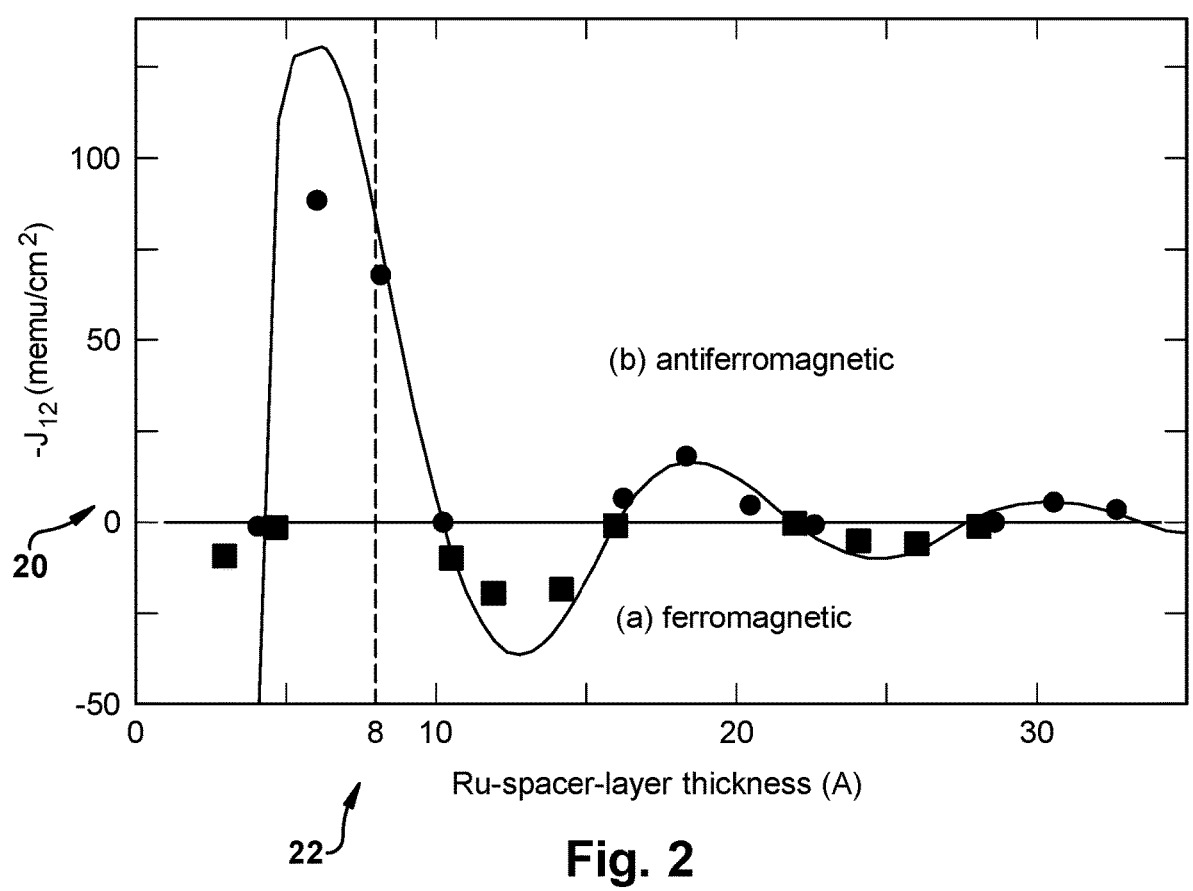
FIG. 2 illustrates the Ruderman-Kittel-Kasuya-Yosida (RKKY) interaction for the Ruthenium (Ru) spacer for the purposes of the present technology.

In an embodiment of the present technology, FIG. 2 illustrates the Ruderman-Kittel-Kasuya-Yosida (RKKY) interaction 20 for the Ruthenium (Ru) spacer. Please, see "*Spin engineering: Direct determination of the Ruderman-Kittel-Kasuya-Yosida far-field range function in ruthenium*" S. S. P. Parkin et al., PHYSICAL REVIEW B VOLUME 44, NUMBER 13 1 Oct. 1991-I. As it is shown in FIG. 2, at Ru-spacer layer thickness of 8 Å (22) the sign of RKKY interaction is an antiferromagnetic one. The oscillatory interlayer exchange interaction between two magnetic layers separated by a metallic spacer (RKKY interaction) is one of the few coherent quantum phenomena that persists at room temperature. It was shown that this interaction can be controlled dynamically by illuminating the sample (e.g. a spin valve) with radiation in the (10-100) THz range. It was predicted that the exchange interaction could be changed from ferromagnetic to anti-ferromagnetic (and vice versa) by tuning the amplitude and/or the frequency of the illuminating radiation. The chief theoretical result was an expression that related the dynamical exchange interaction to the static one that has already been extensively measured. Please, see: "*Control of the Oscillatory Interlayer Exchange Interaction with Terahertz Radiation*", Uta Meyer, Géraldine Haack, Christoph Groth, and Xavier Wainta; Phys. Rev. Lett. 118, 097701—Published 3 Mar. 2017.

The Main Idea of the present invention is to use the Terahertz Magnon Laser (U.S. patent application Ser. No. 16/245,224 titled "TUNABLE MULTILAYER TERAHERTZ MAGNON GENERATOR" and filed on Jan. 10, 2019; and U.S. patent application Ser. No. 16/245,247 titled "TERAHERTZ MAGNON GENERATOR COMPRISING PLURALITY OF SINGLE TERAHERTZ MAGNON LASERS") to manipulate an RKKY-based spacer in a conventional memory cell to provide for a very fast recording capability (please, see below).

Magnetoresistive RAM (MRAM—Magnetoresistive Random Access Memory) is one of the newest approaches to non-volatile memory and stores data in magnetic storage elements called magnetic tunnel junctions (MTJs). MRAM has an especially promising future as it seeks to encompass all the desirable features of the other popular types of memory (non-volatility, infinite endurance, high-speed reading/writing, low cost). "*The Emergence of Practical MRAM*" *Crocus* Technology|Magnetic Sensors|TMR Sensors" (PDF). Archived from the original (PDF) on 27 Apr. 2011. Retrieved 20 Jul. 2009

The first generation of MRAM, such as Everspin Technologies' 4 Mbit, utilized field-induced writing. The second generation is developed mainly through two approaches: Thermal-assisted switching (TAS) which is being developed by *Crocus* Technology, and Spin-transfer torque (STT) which *Crocus*, Hynix, IBM, and several other companies are developing. "*Tower invests in Crocus, tips MRAM foundry deal*". EE Times. Archived from the original on 2012 Jan. 19. Retrieved 2014 Jan. 28. The first storage element used in MRAM for storing information was based on spin valve structure.

Figure 3:
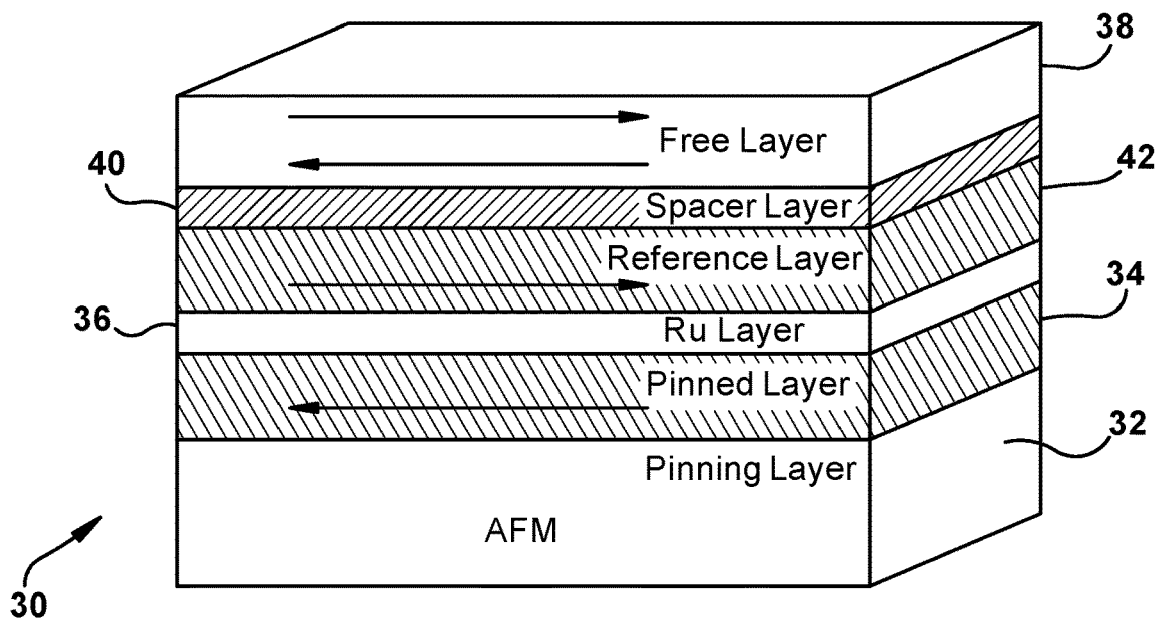
FIG. 3 shows the schematics of spin valve structure used in read-sensors of hard-drive and in the initial investigations of magnetic random-access memory for the purposes of the present technology.

In an embodiment of the present technology, FIG. 3 shows the schematics of spin valve structure 30 used in read-sensors of hard-drive and in the initial investigations of magnetic random-access memory.

The spin valve structure 30 consists of the free/-soft layer 38, the reference layer 42, an RKKY Ru layer 36, a hard/pinned layer 34, and an antiferromagnetic (AFM) pinning layer 32. The pinned layer (PL) 34 is pinned by the pining layer 32 in a certain direction and its magnetization is fixed and should not be reversed during the operation of the memory device.

For better functionality of the memory device, the pinned layer (PL) is made of two antiferromagnetically coupled by Ru layer 36 layers (34 and 42) to reduce the stray field, which may affect the free layer (FL) stability. Although a pinned layer 34 is mainly used in in-plane MRAM, we also use pinned layer to refer to the fixed layer or reference layer 42 of a perpendicular MRAM.

As a result, the magnetostatics fields from the pinned layer 34 (and reference layer 42) are cancelled and do not penetrate onto the free layer 38.

Figure 4:
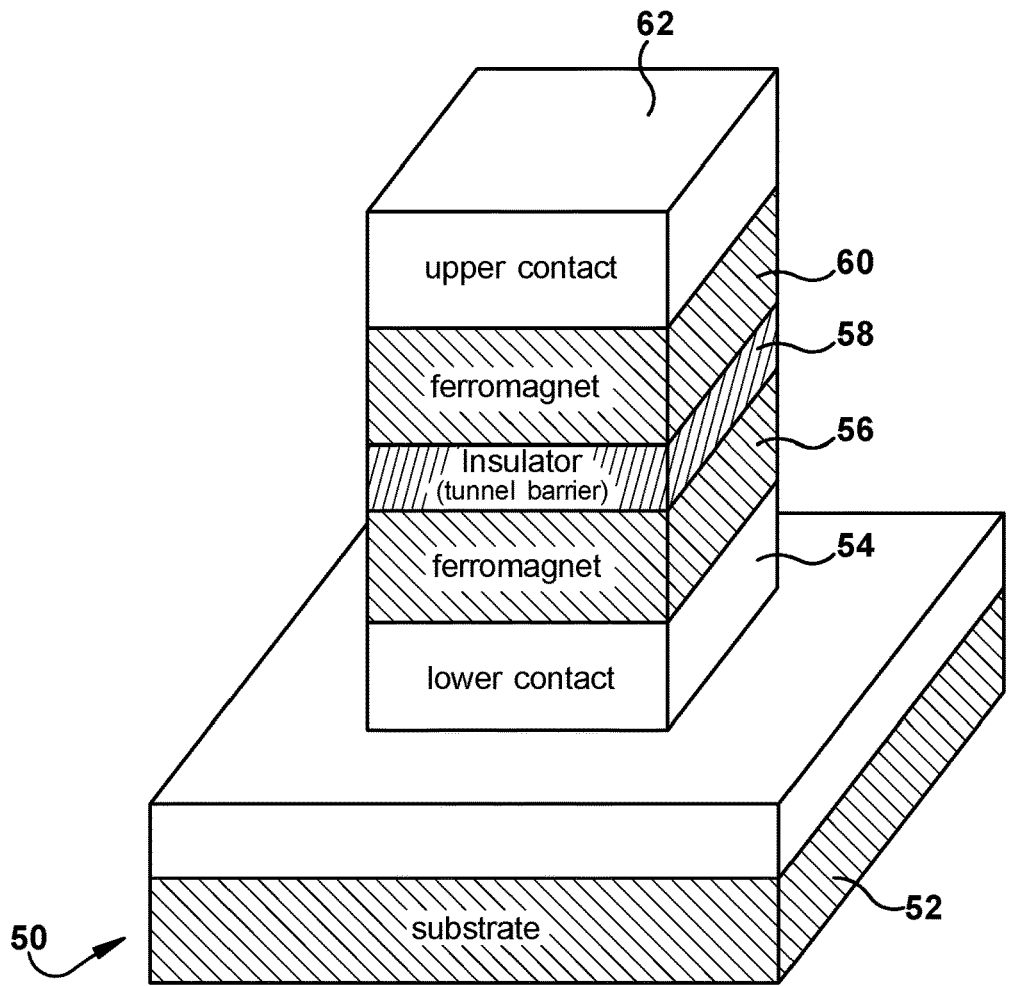
FIG. 4 depicts the magnetic tunnel junction (MTJ) for the purposes of the present technology.

The Ru spacer 36 that has thickness of 8 Å corresponding to an antiferromagnetic sign of RKKY exchange interaction, (as shown in FIG. 2) can be used The tunnel magnetoresistance (TMR) is a magnetoresistive effect that occurs in a magnetic tunnel junction (MTJ) 50 (of FIG. 4).

MTJ 50 consists of two ferromagnets 56 and 60 separated by a thin insulator-tunnel junction 58, the lower contact 54 and the upper contact 62 are used to apply voltage. An MTJ cell consists of a thin layer of an insulating material, sandwiched by two magnetic layers (pinned layer and free layer). Similar to a spin valve, the resistance states can be high (antiparallel orientation) or low (parallel orientation) based on the relative orientation of magnetizations of pinned layer and free layer. With the high reading signal found in MTJ, research interest in spin valves decreased strongly.

The direction of the two magnetizations of the ferromagnetic films 56 and 60 can be switched individually by an external magnetic field. If the magnetizations are in a parallel orientation it is more likely that electrons will tunnel through the insulating film than if they are in the oppositional (antiparallel) orientation. Consequently, such a junction can be switched between two states of electrical resistance, one with low and one with very high resistance.

MTJ is the predominant storage element in MRAMs for the past decade. The current MRAM products use MTJs because the difference between the resistance states is significant enough to produce the voltage swing required for application. The read heads of modern hard disk drives work on the basis of magnetic tunnel junctions.

Figure 5:
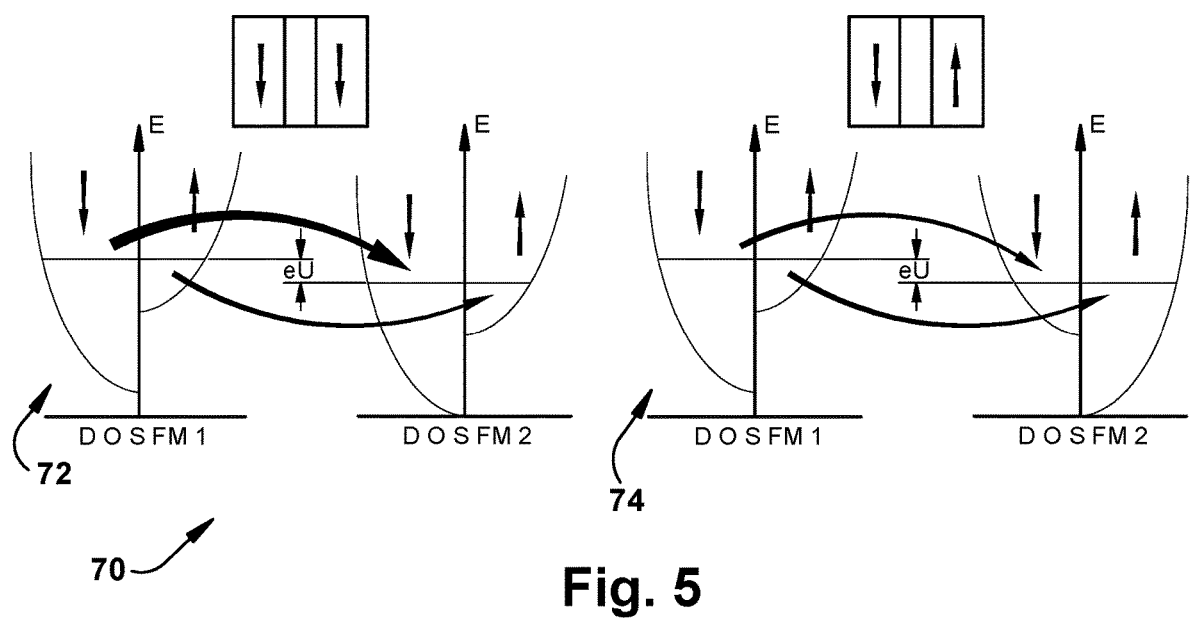
FIG. 5 illustrates the two-current model for parallel and anti-parallel alignment of the magnetizations (DOS—stands for density of states) for the purposes of the present technology.

FIG. 5 illustrates a two-current model 70 for parallel 72 alignment (low resistance) and anti-parallel 74 alignment (high resistance) of the magnetizations (DOS—stands for density of states).

The STT (Spin-transfer torque) is an effect in which the orientation of a magnetic layer in a magnetic tunnel junction or spin valve can be modified using a spin-polarized current. An electric current is generally unpolarized (consisting of 50% spin-up and 50% spin-down electrons); a spin polarized current is one with more electrons of either spin. By passing a current through a thick magnetic layer (usually called the "fixed layer"), one can produce a spin-polarized current. If this spin-polarized current is directed into a second, thinner magnetic layer (the "free layer"), the angular momentum can be transferred to this layer, changing its orientation. This can be used to excite oscillations or even flip the orientation of the magnet. The effects are usually seen only in nanometer scale devices.

Figure 6:
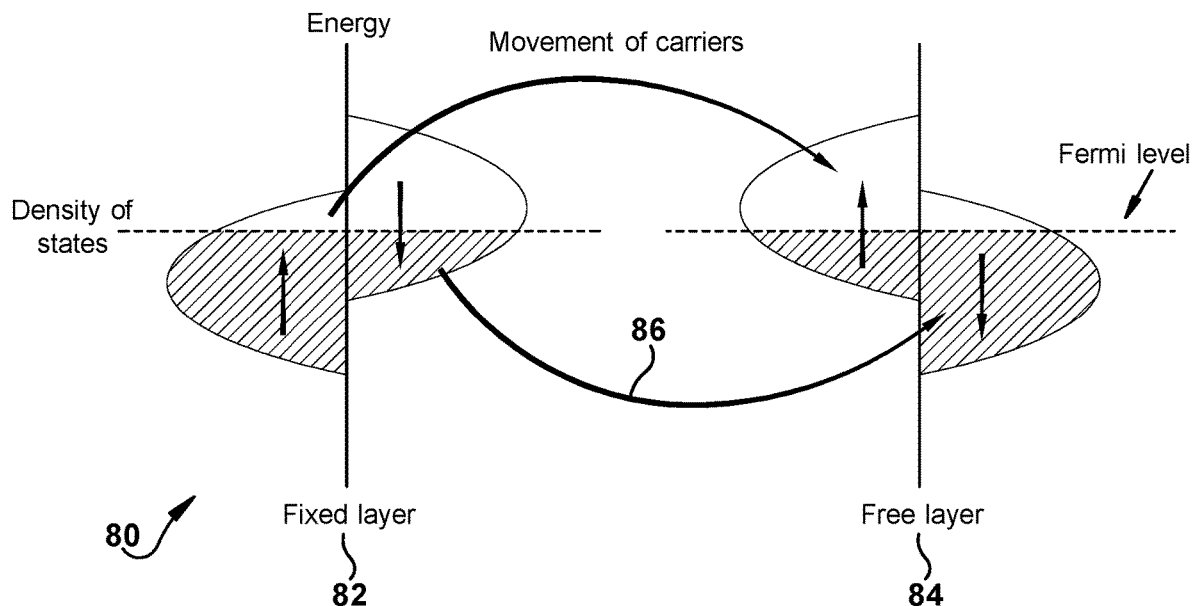
FIG. 6 shows a simple model of spin-transfer torque for two anti-aligned layers for the purposes of the present technology.

FIG. 6 shows a simple model 80 of spin-transfer torque (STT) for two anti-aligned layers (fixed layer 82 and free layer 84) for the purposes of the present technology. Current 86 flowing out of the fixed layer 82 into the free layer 84 is spin-polarized. When it reaches the free layer 84 the majority spins relax into lower energy states of opposite spin, applying a torque to the free layer 86 in the process. Spin-transfer torque technology has the potential to make possible MRAM devices combining low current requirements and reduced cost; however, the amount of current needed to reorient the magnetization is presently too high for most commercial applications, and the reduction of this current density alone is the basis for present academic research in spin electronics.

Figure 7:
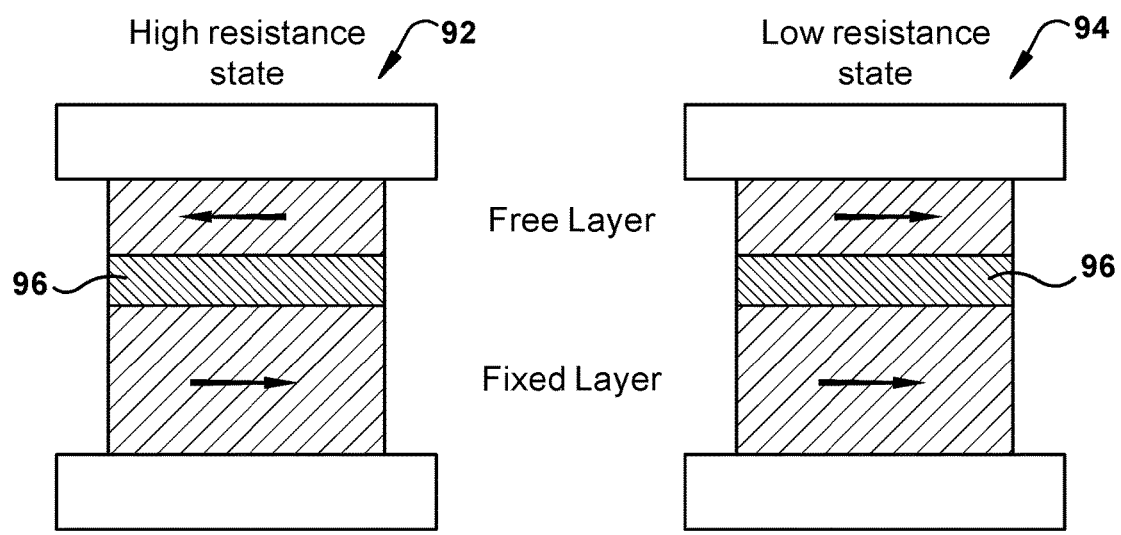
FIG. 7 depicts a schematic diagram of a spin valve/ magnetic tunnel junction for the purposes of the present technology.

FIG. 7 is a schematic diagram 90 of a spin valve/magnetic tunnel junction. In a spin valve the spacer layer 96 is metallic; in a magnetic tunnel junction it is insulating.

Figure 8:
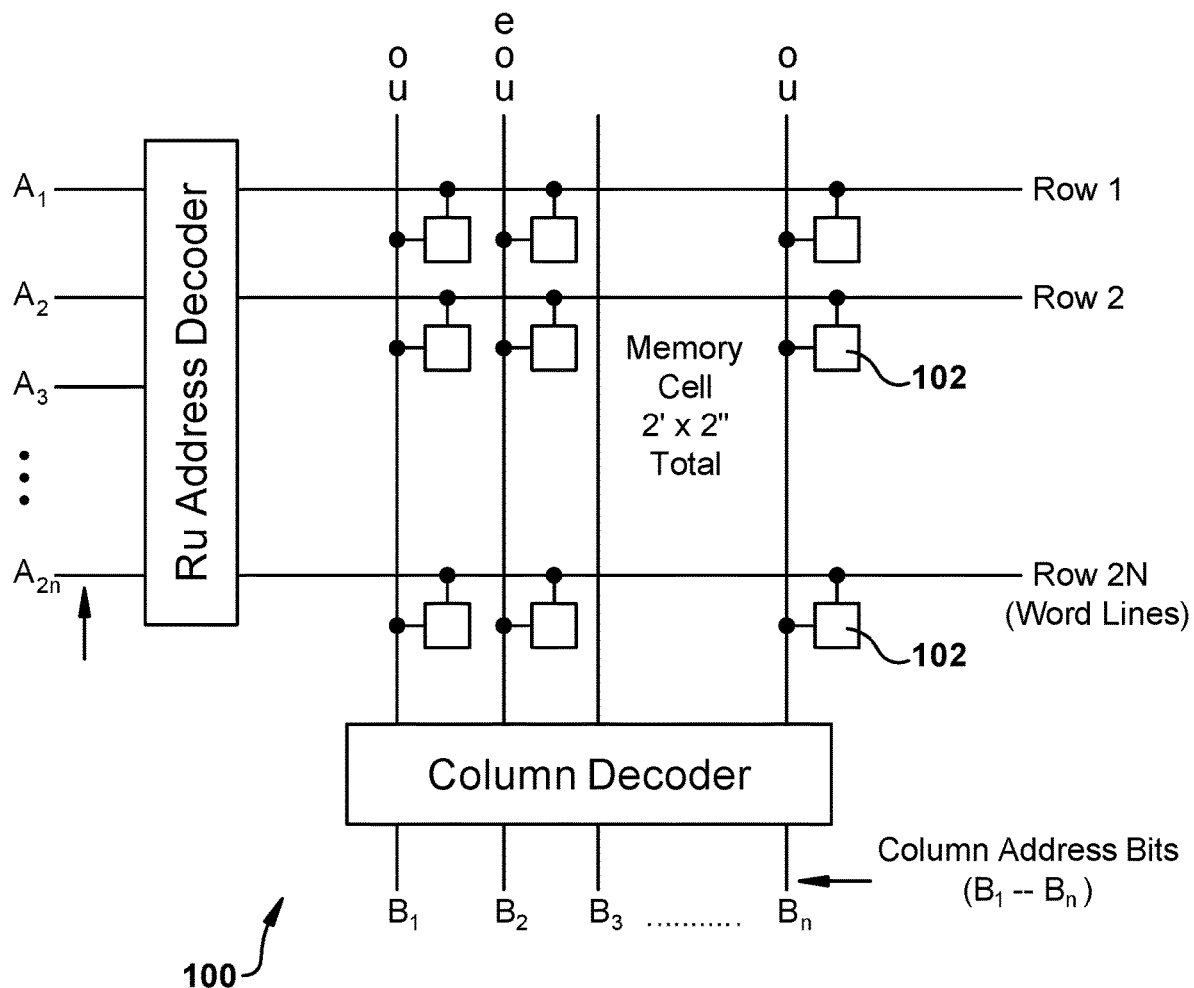
FIG. 8 illustrates a schematic view of MRAM cells in a typical architecture for the purposes of the present technology.

FIG. 8 shows an illustration 100 of MRAM architecture. Arrays of several MRAM cells 102 form a memory device. (Materials Today, volume 20, number 9, November 2017. "*Spintronics-based Random Access Memory: A Review*", Sabpreet Bhatti et al.)

Magnetic storage media can be classified as either sequential access memory or random-access memory, although in some cases the distinction is not perfectly clear. The access time can be defined as the average time needed to gain access to stored records. In the case of magnetic wire, the read/write head only covers a very small part of the recording surface at any given time. Accessing different parts of the wire involves winding the wire forward or backward until the point of interest is found. The time to access this point depends on how far away it is from the starting point. The case of ferrite-core memory is the opposite. Every core location is immediately accessible at any given time.

Hard disks and modern linear serpentine tape drives do not precisely fit into either category. Both have many parallel tracks across the width of the media and the read/write heads take time to switch between tracks and to scan within tracks. Different spots on the storage media take different amounts of time to access. For a hard disk this time is typically less than 10 ms, but tapes might take as much as 100 s.

Figure 9A:
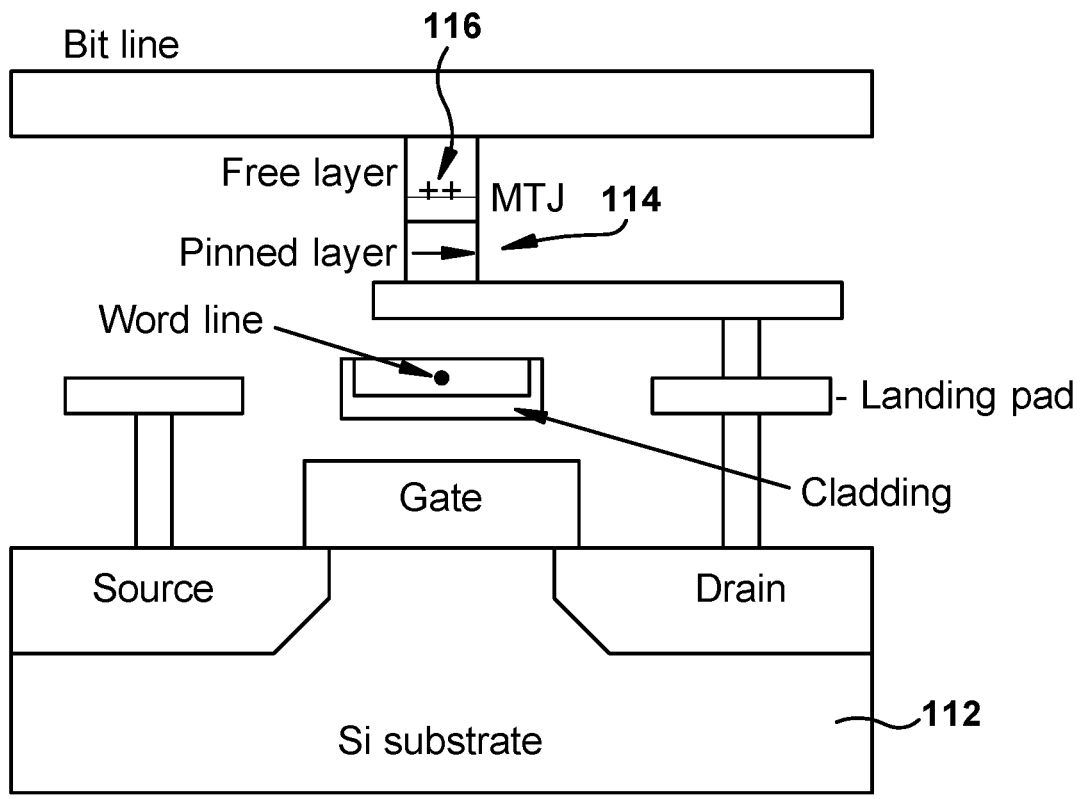
FIGS. 9A and 9B show schematics of a conventional MRAM based on magnetic field induced writing and the selection process involved in the selection of a particular MRAM cell for the purposes of the present technology.
Figure 9B:
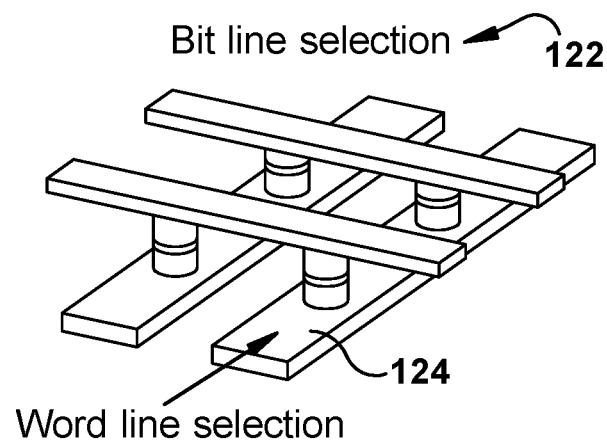

FIG. 9A shows a schematic 110 of a conventional MRAM based on magnetic field induced writing and the selection process involved in the selection of a particular MRAM cell for the purposes of the present technology. A typical MRAM cell has a transistor 112 and a magnetoresistive element 114. Only the free layer 116 of a selected MRAM cell 110 will switch, due to a higher applied total magnetic field. (Materials Today, volume 20, number 9, November 2017. *"Spintronics-based Random Access Memory: A Review"*, Sabpreet Bhatti et al.) The MTJ selection in MRAM is illustrated in FIG. 9B in subfigure 120 where 124 represents a word line selection and 122—a bit line selection.

Figure 10A:
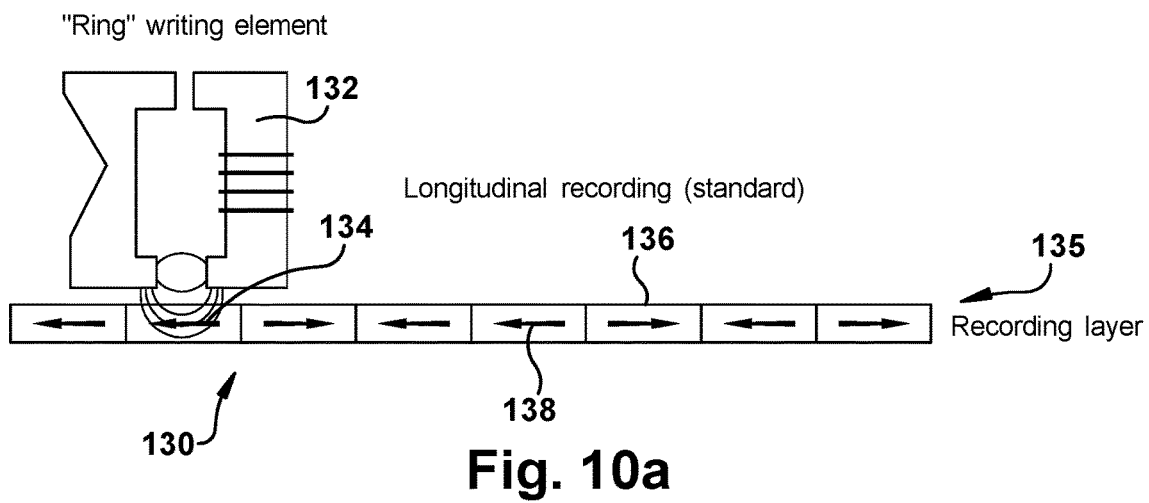
FIG. 10 A depicts a longitudinal recording and FIG. 10 B illustrates a perpendicular recording for the purposes of the present technology.
Figure 10B:
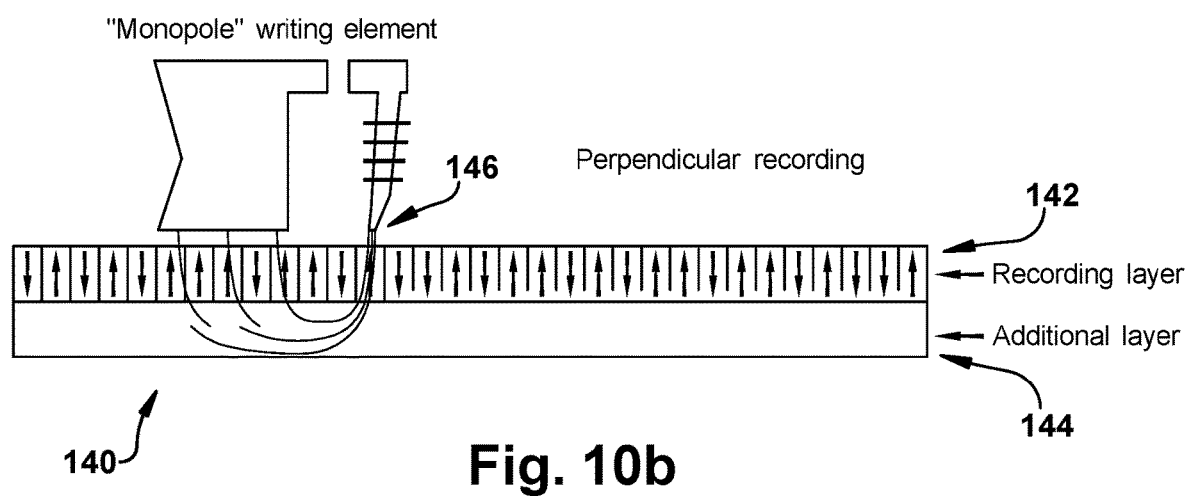

FIG. 10 A illustrates a longitudinal recording 130 and FIG. 10 B depicts a perpendicular recording 140.

In longitudinal recording 130, a magnetic head 132 writes by changing the magnetic field 134 that is parallel to the surface 136 of the magneto resistive random-access memory or MRAM. The change of the magnetic field causes the change of the orientation of the magnetic bit 138 of the recording layer 135. This process is based on the tunnel magnetoresistance (TMR) effect. Its advantage is non-volatility, low power usage, and good shock robustness. The 1 st generation that was developed was produced by Everspin Technologies and utilized field induced writing. MRAM Technology Attributes Archived, Jun. 10, 2009, at the Wayback Machine.

The perpendicular recording 140, as shown in FIG. 10 B, is based on the spin-transfer torque (STT) on which Crocus, Hynix, IBM, and several other companies are working. In this type of recording the magnetic field generated by monopole writing element 146 varies in the direction perpendicular to the surface of the cell 146 of the recording layer 142. *"Tower invests in Crocus, tips MRAM foundry deal"*. EE Times. Archived from the original on 2012 Jan. 19. Retrieved 2014 Jan. 28.

Figure 11A:
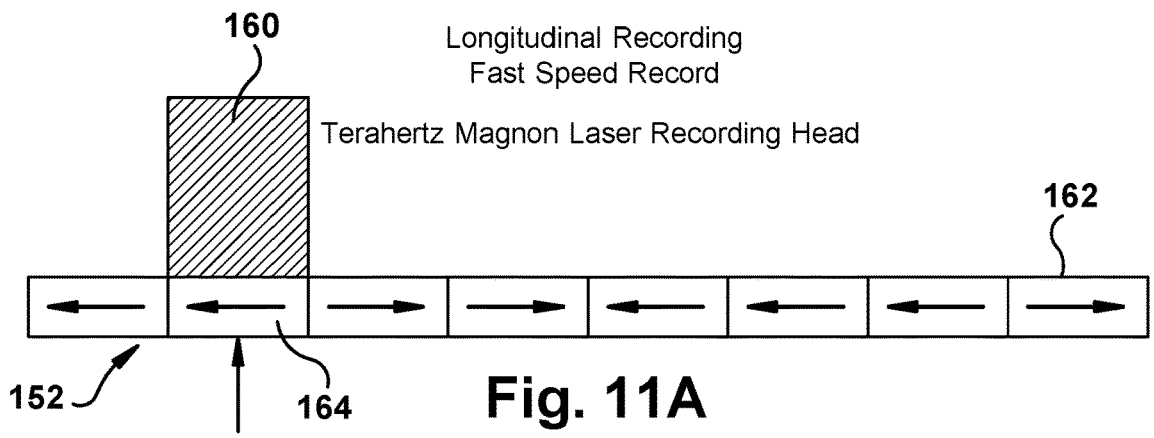
FIG. 11 illustrates a novel technique of high-speed magnetic recording based on manipulating RKKY (Ruderman-Kittel-Kasuya-Yosida) enabled pinning layer in MTJ (Magnetic Tunnel Junction)-based memory by using Terahertz Magnon Laser for the purposes of the present technology.
Figure 11B:
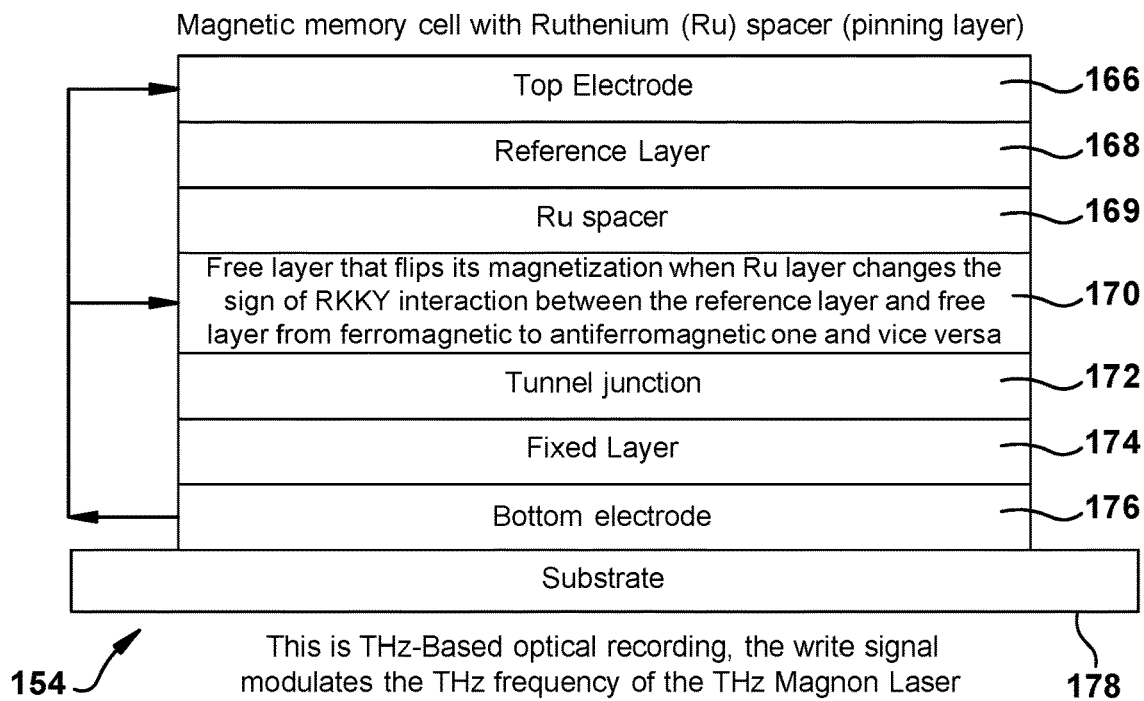
Figure 11C:
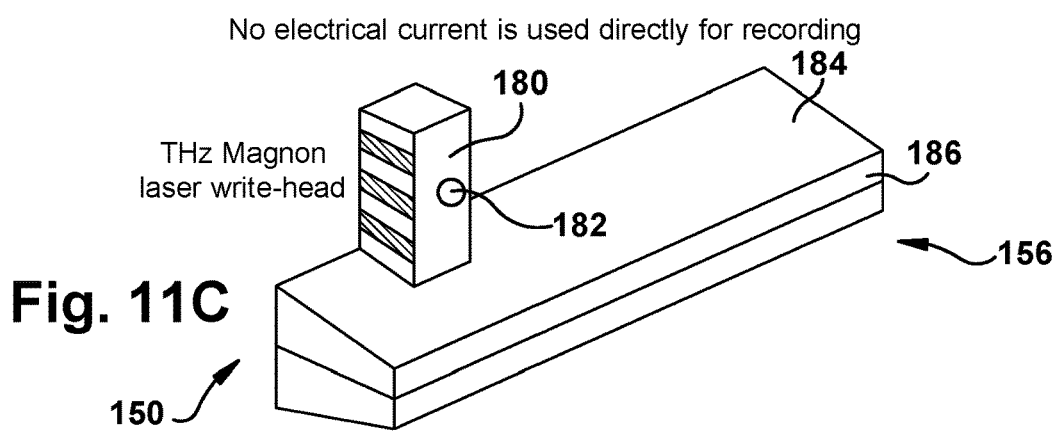

This application discloses a novel technique of high-speed magnetic recording based on manipulating RKKY (Ruderman-Kittel-Kasuya-Yosida) enabled pinning layer in MTJ (Magnetic Tunnel Junction)-based memory by using Terahertz Magnon Laser as shown in FIG. 11.

More specifically, we use the THz Magnon Laser 160 as an optical writing head for longitudinal recording by changing the orientation of a single memory cell 164 on the recoding layer 162. The change of the orientation is achieved by changing the exchange interaction sign from ferromagnetic to antiferromagnetic and vice versa of the RKKY spacer 164 (Ru spacer) of the MTJ memory cell 154.

More specifically, the memory cell 154 comprises a substrate 178, a bottom electrode 176, a fixed layer 174, a tunnel junction 172, a free layer 170, a Ru spacer 164, a reference layer 168, and a top electrode 166.

The free layer 170 flips its magnetization when the RKKY spacer 164 changes the sign of its RKKY interaction between the reference layer 168 and free layer 170 from ferromagnetic to antiferromagnetic and vice versa.

This can be done by illuminating the memory cell 154 by using the Terahertz Magnon laser recording head 160 that generates the terahertz writing (or recording) signal in the range between (10 and 100) THz as was disclosed in *"Control of the Oscillatory Interlayer Exchange Interaction with Terahertz Radiation"*, Uta Meyer, Géraldine Haack, Christoph Groth, and Xavier Wainta; Phys. Rev. Lett. 118, 097701—Published 3 Mar. 2017.

The physics of THz Magnon Laser was disclosed in U.S. Pat. No. 7,508,578 that is incorporate herein in its entirety. In the U.S. patent application Ser. No. 16/245,224, filed on Jan. 10, 2019 and entitled "TUNABLE MULTILAYER TERAHERTZ MAGNON GENERATOR" the voltage-based tuning of the Magnon laser was disclosed.

It was shown, that the bias voltage 6V applied between the top electrode and the bottom electrode across at least one multilayer tunable microcolumn is configured to shift the Fermi level of the spin injector with respect to the Fermi level of the ferromagnetic material. The minority electrons having spin down are injected into the Magnon Gain Medium from the spin injector by tunneling via the tunnel junction after the Fermi level of the spin injector is shifted with respect to the Fermi level of the ferromagnetic material are configured to generate non-equilibrium magnons in the Magnon Gain Medium resulting in generation of terahertz radiation.

Let us estimate the frequency of the THz radiation in $Co_2MnSi$ (001)/MgO heterostructures. The relevant parameters are as follows:

(a) The stiffness D=466 meV(Å)$^2$ according to Ritchie L et al., *Phys. Rev. B* 68, 104430. Or D=567 meV(Å)$^2$ according to Jan Thoene, Stanislav Chadov, Gerhard Fecher, Claudia Felser, Jurgen Kubler) *J. Phys. D: Appl. Phys.* 42 (2009) 084013);

(b) The Energy gap
Δ=0.6 eV according to Bjorn Hulsen and Matthias Scheffer; *Phys. Rev Let.* 103, 046802 (2009).

(c) The Effective electron mass $m_{eff}$=(1.15-1.67) $m_0$ according to Steffen Kaltenborn and Hans Christian Schneider, *Phys. Rev B* 88, 045124 (23013); D. Y. Smith, B. Segall, *Phys. Rev. B* 34, 5191 (1986).

(d) Thus, for the frequency of THz radiation is double of min frequency of Spin Wave (at magnon lazing point)

$$\hbar F_{THz} = 2D(q_1)^2 \Rightarrow \qquad (Eq.\ 1)$$

F=(13.10-20.24) THz depending on the values of the parameters that differ from different references.

In general, increase of voltage bias causes increase of minority current by increasing the minority carriers in the sub band with spin down. Indeed, the tunneling of minority electron with max energy via the tunnel junction has the highest probability to propagate into the sub band with spin up by flipping its spin and to generate magnons with the smallest possible magnon lasing wave vector $q=(p_0-p_{\varepsilon max})/\hbar$ that corresponds to the momentum of electron that tunnel with the max energy $\varepsilon_{max}$.

The further increase of bias after the lasing point is reached causes further increase of the max energy and momentum of electrons with the highest tunneling probability which causes further decrease of magnon lasing wave vector and further corresponding decrease of THz frequency.

More specifically, the tuning in this system can be achieved by changing the bias voltage $eV_{bias}=(D+\varepsilon_p)$ by dV. It will result in changing the lasing frequency (tuning) by df:

$$(df/f) = -(dV/V)(\Delta/\varepsilon_p)^{1/2} \qquad (Eq.\ 2)$$

Thus, the tuning of lasing frequency is parametrically larger than the shift in bias voltage because small changes in bias result in large changes in the electron energy and therefore in large changes in lasing frequency. Thus, we can cover the whole THz band in the range of (1-30) THz by using voltage-based tuning.

Referring still to FIG. 11, the high-speed longitudinal recording using THz Magnon Laser head 160 on the memory cell including RKKY enabled spacer 154 is achievable by controlling the magnetic configuration (e.g. parallel versus anti-parallel) of a spin valve by varying the intensity or the frequency of generated terahertz radiation.

Our method of fast recoding on the MRAM comprising the MTJ with Ru spacer (as depicted in FIG. 1) includes the following steps:

(A) Applying a writing signal 182 as a bias voltage signal to the Terahertz Magnon laser head 180, thus generating the THz radiation with modulated THz frequency, whereas the modulated frequency corresponds to the writing signal 182; and (B). Illuminating the RKKY spacer 186 (for example Ru spacer, can be other spacers, like Cu, etc.) by modulated THz signal thus causing the RKKY interaction to change its sign from antiferromagnetic to ferromagnetic (and vice versa) in accordance with the THz writing signal 182 whereas the magnetic tape 184 including a plurality of magnetic cells 154 becomes the recording medium, and whereas the magnetic cell 154 is located in such geometrical position in relation to THz Magnon Laser writing head 180 that THz radiation illuminates the Ru spacer 186.

The reading can be done by using a conventional head that utilizes the tunnel magnetoresistance (TMR) effect. Thus, the reading takes place at the conventional speed, but writing can be done $10^3$ times faster than by using the conventional methods.

Example: High Speed Recoding of Large Data Sets for AI and Data Mining.

Data mining is the process of discovering patterns in large data sets involving methods at the intersection of machine learning, statistics, and database systems. Data mining is an interdisciplinary subfield of computer science and statistics with an overall goal to extract information (with intelligent methods) from a data set and transform the information into a comprehensible structure for further use. Data mining is the analysis step of the "knowledge discovery in databases" process, or KDD. Aside from the raw analysis step, it also involves database and data management aspects, data preprocessing, model and inference considerations, interestingness metrics, complexity considerations, post-processing of discovered structures, visualization, and online updating. The difference between data analysis and data mining is that data analysis is used to test models and hypotheses on the dataset, e.g., analyzing the effectiveness of a marketing campaign, regardless of the amount of data; in contrast, data mining uses machine-learning and statistical models to uncover clandestine or hidden patterns in a large volume of data. To create large volumes of data for further processing the high-speed recording can be of major importance and usage.

The above discussion has set forth the operation of various exemplary systems and devices, as well as various embodiments pertaining to exemplary methods of operating such systems and devices. In various embodiments, one or more steps of a method of implementation (calculating the optimum voltage bias, for example) are carried out by a processor under the control of computer-readable and computer-executable instructions. Thus, in some embodiments, these methods are implemented via a computer.

In an embodiment, the computer-readable and computer-executable instructions may reside on computer useable/readable media.

Therefore, one or more operations of various embodiments may be controlled or implemented using computer-executable instructions, such as program modules, being executed by a computer. Generally, program modules include routines, programs, objects, components, data structures, etc., that perform particular tasks or implement particular abstract data types. In addition, the present technology may also be practiced in distributed computing environments where tasks are performed by remote processing devices that are linked through a communications network. In a distributed computing environment, program modules may be located in both local and remote computer-storage media including memory-storage devices.

Although specific steps of exemplary methods of implementation are disclosed herein, these steps are examples of steps that may be performed in accordance with various exemplary embodiments. That is, embodiments disclosed herein are well suited to performing various other steps or variations of the steps recited. Moreover, the steps disclosed herein may be performed in an order different than presented, and not all of the steps are necessarily performed in a particular embodiment.

Although various electronic and software-based systems are discussed herein, these systems are merely examples of environments that might be utilized and are not intended to suggest any limitation as to the scope of use or functionality of the present technology. Neither should such systems be interpreted as having any dependency or relation to any one or combination of components or functions illustrated in the disclosed examples.

Although the subject matter has been described in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An apparatus comprising:
a terahertz writing head configured to generate a tunable terahertz writing signal comprising a voltage-based tunable magnon laser; and
a memory cell comprising a bottom electrode coupled to a substrate, an antiferromagnetic layer coupled to said bottom electrode, a pinned layer that comprises a first ferromagnetic material in contact with said antiferromagnetic layer to configure a fixed magnetization direction of said pinned layer, a tunnel junction coupled to said pinned layer, a free layer that comprises a second ferromagnetic material configured to be magnetized in a first magnetized direction or a second magnetized direction based on said RKKY interaction, a top electrode coupled to said free layer, and a spacer that comprises a thickness configured based on Ruderman-Kittel-Kasuya-Yosida (RKKY) interaction; said memory cell comprising two separate memory states: a first binary state and a second binary state;
wherein said first binary memory state corresponds to a ferromagnetic sign of said Ruderman-Kittel-Kasuya-Yosida (RKKY) interaction corresponding to a first thickness value of said spacer; and wherein said second binary memory state corresponds to an antiferromagnetic sign of said Ruderman-Kittel-Kasuya-Yosida (RKKY) interaction corresponding to a second thickness value of said spacer;
wherein said thickness of said spacer is manipulated by said tunable terahertz writing signal;
wherein said first thickness value of said spacer corresponds to a first terahertz signal generated by said terahertz writing head;
wherein said second thickness value of said spacer corresponds to a second terahertz signal generated by said terahertz writing head; and wherein said first magnetized direction or said second magnetized direction associated with said RKKY interaction is configured to be modified based on a tunable terahertz writing signal applied to said spacer.

2. The apparatus of claim 1; wherein said voltage-based-tunable terahertz magnon laser further comprises:
a voltage-based tunable terahertz magnon laser configured to generate a frequency tunable terahertz writing signal.

3. The apparatus of claim 1; wherein said voltage-based tunable terahertz magnon laser further comprises:
a voltage-based tunable terahertz magnon laser configured to generate an amplitude tunable terahertz writing signal.

4. The apparatus of claim 1, wherein said first magnetized direction is associated with a first binary state of said memory cell, and wherein said second magnetized direction is associated with a second binary state of said memory cell.

5. The apparatus of claim 1, wherein said first magnetized direction or said second magnetized direction associated with said RKKY interaction is configured to be modified based on an amplitude of a tunable terahertz writing signal applied to said spacer.

6. The apparatus of claim 1, wherein said first magnetized direction or said second magnetized direction associated with said RKKY interaction is configured to be modified based both on an amplitude and on a frequency of a tunable terahertz writing signal applied to said spacer.

7. The apparatus of claim 1, wherein said tunnel junction is selected from a group of materials consisting of:
magnesium oxide (MgO), aluminum oxide ($Al_2O_3$), and spinel $MgAl_2O_4$.

8. The apparatus of claim 1, wherein said substrate is selected from a group of materials consisting of:
gallium arsenide (GaAs), aluminum oxide ($Al_2O_3$), aluminum nitride (AlN), indium-tin-oxide (InTnO), silicon (Si), silicone on sapphire (SoS), and magnesium oxide (MgO).

9. The apparatus of claim 1, wherein said bottom electrode is selected from a group of materials consisting of:
cobalt iron alloy ($Co_{0.5}Fe_{0.5}$), silver (Ag), gold (Au); platinum (Pt), cobalt (Co), palladium (Pd), titanium (Ti), and titanium tungsten (TiW).

10. The apparatus of claim 1, wherein said spacer that comprises a thickness configured based on Ruderman-Kittel-Kasuya-Yosida (RKKY) interaction is selected from a group of materials consisting of:
Ruthenium (Ru); and Copper (Cu).

11. A method of magnetic recording by employing a memory cell, comprising a bottom electrode coupled to a substrate, an antiferromagnetic layer coupled to said bottom electrode, a pinned layer that comprises a first ferromagnetic material in contact with said antiferromagnetic layer to configure a fixed magnetization direction of said pinned layer, a tunnel junction coupled to said pinned layer, a spacer that comprises a thickness configured based on Ruderman-Kittel-Kasuya-Yosida (RKKY) interaction, a free layer that comprises a second ferromagnetic material configured to be magnetized in a first magnetized direction or a second magnetized direction based on said RKKY interaction, and a top electrode coupled to said free layer; said memory cell comprising two separate memory states: a first binary state and a second binary state; wherein said first binary memory state corresponds to a ferromagnetic sign of said Ruderman-Kittel-Kasuya-Yosida (RKKY) interaction corresponding to a first thickness value of said spacer; and wherein said second binary memory state corresponds to an antiferromagnetic sign of said Ruderman-Kittel-Kasuya-Yosida (RKKY) interaction corresponding to a second thickness value of said spacer; wherein said thickness of said spacer is manipulated by said tunable terahertz writing signal;
said method comprising:
generating a tunable terahertz writing signal via a terahertz magnon laser; and
modifying said first magnetized direction or said second magnetized direction associated with said RKKY interaction of said memory cell based on said tunable terahertz writing signal.

12. The method of claim 11, wherein said generating comprises employing said terahertz magnon laser as an optical writing head for said memory cell.

13. The method of claim 11, wherein said modifying comprises modifying said first magnetized direction or said second magnetized direction associated with said RKKY interaction of said memory cell based on an amplitude of said tunable terahertz writing signal.

14. The method of claim 11, wherein said modifying comprises modifying said first magnetized direction or said second magnetized direction associated with said RKKY interaction of said memory cell based on a frequency of said tunable terahertz writing signal.

15. The method of claim 11, further comprising:
applying said tunable terahertz writing signal to said spacer.

16. The method of claim 11, further comprising:
applying a bias voltage to shift a Fermi level of a spin injector of said terahertz magnon laser with respect to a Fermi level of a Magnon Gain Medium of said terahertz magnon laser to initiate generation of non-equilibrium magnons by injecting minority electrons into said Magnon Gain Medium, wherein injected minority electrons pass into high energy electronic states in a lower sub band with spin up of ferromagnetic material associated with said Magnon Gain Medium by flipping spin during an exchange process, wherein non-equilibrium magnons are generated during said exchange process, and wherein interaction between said non-equilibrium magnons causes generation of electromagnetic radiation associated with said tunable terahertz writing signal.

17. The method of claim 11, further comprising:
tuning a frequency of said tunable terahertz writing signal by changing a value of said bias voltage.

* * * * *